United States Patent
Kim

(10) Patent No.: US 8,410,521 B2
(45) Date of Patent: Apr. 2, 2013

(54) SEMICONDUCTOR LIGHT EMITTING DEVICE

(75) Inventor: Sung Kyoon Kim, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 294 days.

(21) Appl. No.: 12/714,836

(22) Filed: Mar. 1, 2010

(65) Prior Publication Data
US 2010/0219439 A1    Sep. 2, 2010

(30) Foreign Application Priority Data
Mar. 2, 2009  (KR) .................. 10-2009-0017734

(51) Int. Cl.
*H01L 31/102* (2006.01)
(52) U.S. Cl. .............. 257/184; 257/E33.006; 438/29
(58) Field of Classification Search .......... 257/9, 11, 257/12, 13, 14, 21, 79, 184, 189, 190, 431, 257/436, 461, 465, E21.219; 438/29, 745
See application file for complete search history.

(56) References Cited

U.S. PATENT DOCUMENTS

| 5,727,015 | A  | 3/1998 | Takahashi et al. |
| 7,053,420 | B2 | 5/2006 | Tadatomoto et al. |
| 2006/0267025 | A1 | 11/2006 | Wuu et al. |
| 2007/0241350 | A1 | 10/2007 | Kim |
| 2007/0241362 | A1 | 10/2007 | Han et al. |
| 2008/0128716 | A1* | 6/2008 | Tazima et al. ............... 257/88 |
| 2008/0251803 | A1 | 10/2008 | Cho et al. |
| 2009/0159871 | A1* | 6/2009 | Lee et al. ............... 257/13 |

FOREIGN PATENT DOCUMENTS

| EP | 1 265 273 A1 | 12/2002 |
| KR | 10-2007-0097640 A | 10/2007 |
| WO | WO-2007/001141 A1 | 1/2007 |
| WO | WO-2008/082097 A1 | 7/2008 |
| WO | WO-2009/002129 A2 | 12/2008 |

* cited by examiner

*Primary Examiner* — Julio J Maldonado
*Assistant Examiner* — Sonya D McCall Shepard
(74) *Attorney, Agent, or Firm* — Birch, Stewart, Kolasch & Birch, LLP

(57) ABSTRACT

Provided is a semiconductor light emitting device. The semiconductor light emitting device comprises a substrate, a first semiconductor layer on substrate, an air-gap part disposed in at least portion between the substrate and the first semiconductor layer, and a plurality of compound semiconductor layers comprising a first conductive type semiconductor layer, an active layer, and a second conductive type semiconductor layer on the first semiconductor layer.

19 Claims, 8 Drawing Sheets

SEMICONDUCTOR LIGHT EMITTING DEVICE

CROSS-REFERENCE TO RELATED APPLICATIONS

The present application claims priority under 35 U.S.C. §119 to Korean Patent Application No. 10-2009-0017734 (filed on Mar. 2, 2009), which is hereby incorporated by reference in its entirety.

BACKGROUND

Embodiments relate to a semiconductor light emitting device.

Groups III-V nitride semiconductors have been variously applied to an optical device such as blue/green light emitting diodes (LEDs), a high speed switching device, such as a MOSFET (Metal Semiconductor Field Effect Transistor) and an HEMT (Hetero junction Field Effect Transistors), and a light source of a lighting device or a display device.

The nitride semiconductor is mainly used for the LED (Light Emitting Diode) or an LD (laser diode), and studies have been continuously conducted to improve the manufacturing process or a light efficiency of the nitride semiconductor.

SUMMARY

Embodiments provide a semiconductor light emitting device having a light extraction structure between a substrate and a first semiconductor layer.

Embodiments provide a semiconductor light emitting device having an air-gap part between a substrate and a first semiconductor layer.

Embodiments provide a semiconductor light emitting device in which an opening part is disposed within a first semiconductor layer and an air-gap part connected to the opening part is disposed between a substrate and the first semiconductor layer.

The details of one or more embodiments are set forth in the accompanying drawings and the description below. Other features will be apparent from the description and drawings, and from the claims.

An embodiment provides a semiconductor light emitting device comprising: a substrate; a first semiconductor layer on substrate; an air-gap part disposed in at least portion between the substrate and the first semiconductor layer; and a plurality of compound semiconductor layers comprising a first conductive type semiconductor layer, an active layer, and a second conductive type semiconductor layer on the first semiconductor layer.

An embodiment provides a semiconductor light emitting device comprising: a substrate having a top surface with a concave-convex structure; a first semiconductor layer on substrate; an air-gap part between the substrate and the first semiconductor layer; and a plurality of compound semiconductor layers comprising a first conductive type semiconductor layer, an active layer, and a second conductive type semiconductor layer on the first semiconductor layer.

An embodiment provides a semiconductor light emitting device comprising: a substrate; a concave-convex part on the substrate; a first semiconductor layer on the substrate; an air-gap part between the substrate and the first semiconductor layer; a first conductive type semiconductor layer on the first semiconductor layer; an active layer on the first conductive type semiconductor layer; a second conductive type semiconductor layer on the active layer; a first electrode electrically connected to the first conductive type semiconductor layer; and a second electrode electrically connected to the second conductive type semiconductor layer.

The details of one or more embodiments are set forth in the accompanying drawings and the description below. Other features will be apparent from the description and drawings, and from the claims.

DETAILED DESCRIPTION OF THE EMBODIMENTS

Figure 1:
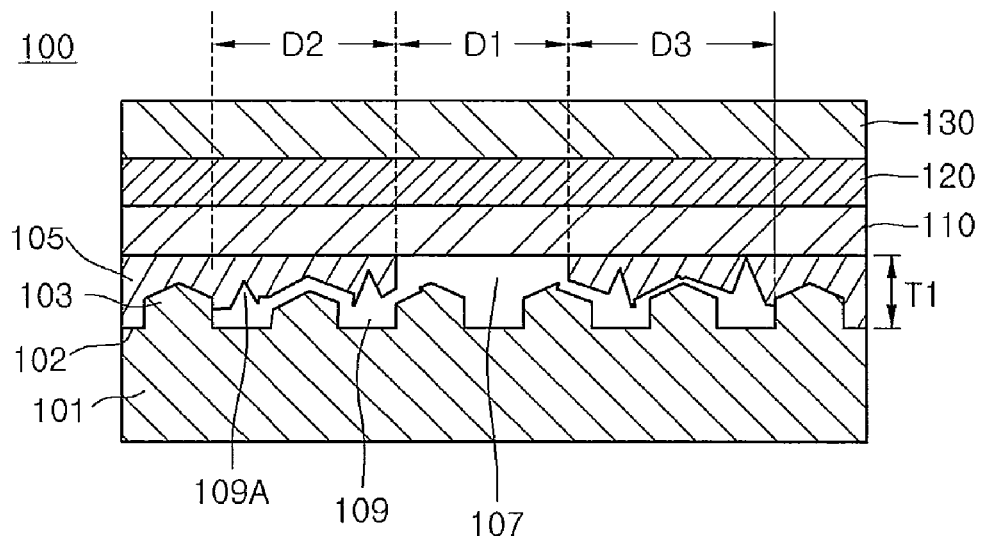
FIG. 1 is a side sectional view of a semiconductor light emitting device according to a first embodiment.

Reference will now be made in detail to the embodiments of the present disclosure, examples of which are illustrated in the accompanying drawings. In the description of embodiments, it will be understood that when a layer is referred to as being 'on' or 'under' another layer, the reference about 'on' and 'under' each layer will be made on the basis of drawings.

Also, the thickness of each layer in the drawings is an example, and is not limited thereto.

In the description of embodiments, it will be understood that when a layer (or film), region, pattern or structure is referred to as being 'on' another layer (or film), region, pad or pattern, the terminology of 'on' and 'under' includes both the meanings of 'directly' and 'indirectly'.

Referring to FIG. 1, a semiconductor light emitting device 100 includes a substrate 101, a first semiconductor layer 105, an opening part 107, an air-gap part 109, a first conductive type semiconductor layer 110, an active layer 120, and a second conductive type semiconductor layer 130.

The substrate 101 may include an insulation substrate or a conductive substrate. For example, the substrate 101 may be formed of at least one of $Al_2O_3$, SiC, Si, GaAs, GaN, ZnO, Si, GaP, InP, Ge, and $Ga_2O_3$. Concave and convex parts 102 and 103 may be disposed on the substrate 101. The concave and convex parts 102 and 103 may have a matrix or stripe shape. The convex part 103 may have a pattern shape such as a lens, column, or horn shape, but is not limited thereto.

The convex part 103 may be formed by etching the substrate 101 or using a separate mask layer. The convex part 103 of the substrate 101 disposed at the air-gap part 109 is formed at an irregular shape or a random shape by etching the substrate 101.

The first semiconductor layer 105 is disposed on the substrate 101. The first semiconductor layer 105 may be formed of a compound semiconductor of Group III-V elements. For example, the first semiconductor layer 105 may be formed of one of GaN, InN, AlN, InGaN, AlGaN, InAlGaN, and AlInN. The first semiconductor layer 105 may have a single layer structure or a multi-layered structure. The first semiconductor layer 105 may include an undoped semiconductor layer or a conductive semiconductor layer doped with a dopant. The first semiconductor layer 105 may have a thickness T1 of about 0.01 um to about 20 um. A buffer layer using a compound semiconductor of Group II to VI elements may be disposed between the substrate 101 and the first semiconductor layer 105. The buffer layer may reduce a lattice constant difference between the substrate 101 and the first semiconductor layer 105.

The opening part 107 may be defined in a predetermined region of the first semiconductor layer 105. The opening part 107 may have a circular, polygonal, or random shape. At least one opening part 107 may be defined within the first semiconductor layer 105. The plurality of opening parts 107 may spaced from each other. The opening parts 107 may be connected to the air-gap part 109 or communicate with the air-gap part 109.

The opening part 107 may have a depth within the first semiconductor layer 105 to expose the substrate 101. One or more convexes 103 upwardly protruding from the substrate 101 may be disposed below the opening part 107.

Figure 2:
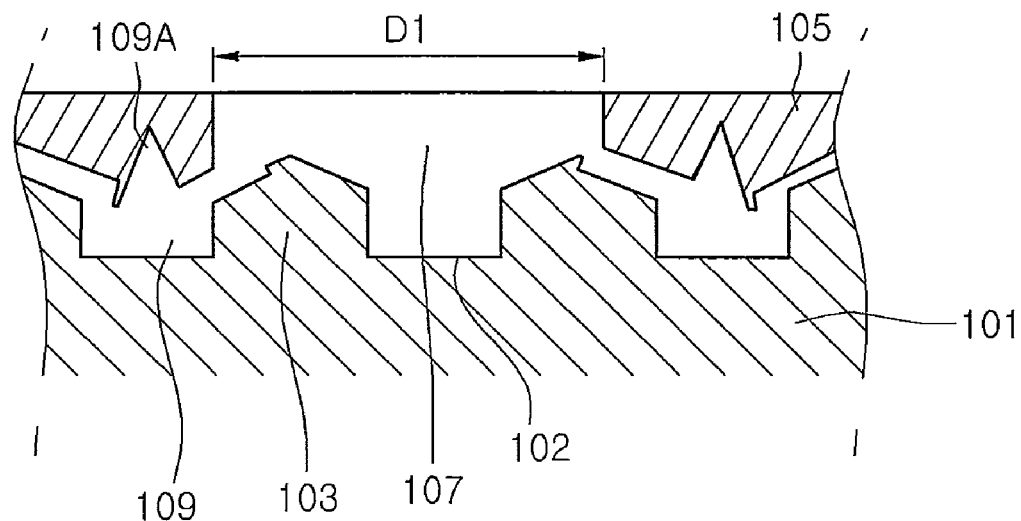
FIG. 2 is a partially enlarged view of FIG. 1.

As shown in FIG. 2, the opening part 107 may have a predetermined diameter D1, e.g., a diameter of about 0.01 um to about 10 um. The diameter D1 of the opening part 107 may be defined within a predetermined range to maintain a portion of the opening part 107 even through the first conductive type semiconductor layer 110 is disposed. In an embodiment, the first conductive type semiconductor layer 110 may be filled into the opening part 107, and it may be changed according to the diameter D1 of the opening part 107.

The air-gap part 109 is defined between the first semiconductor layer 105 and the substrate 101. The air-gap part 109 is connected to the opening part 107 and extends by a predetermined length along an interface between the first semiconductor layer 105 and the substrate 101. The air-gap part 109 extends outwardly by predetermined lengths D2 and D3 with respect to a center of the opening part 107. Here, the sum of the lengths D2 and D3 of the air-gap part 109 may be greater than the diameter D1 of the opening part 107.

The air-gap part 109 has an uneven shape around the opening part 107, e.g., a concave-convex shape along the interface between the substrate 101 and the first semiconductor layer 105. Thus, the air-gap part 109 provides an irregular air-gap between the substrate 101 and the first semiconductor layer 105.

The air-gap part 109 may have an uneven shape with respect to a bottom surface of the first semiconductor layer 105. In this case, a portion of the air-gap part 109 may have a horn shape such as a cone, polygonal horn, or atypical shape below the first semiconductor layer 105. A critical angle of light proceeding into the first semiconductor layer 105 may be changed by the shape of the air-gap part 109 to improve light extraction efficiency.

Since the opening part 107 and the air-gap part 109 use air as a medium, they have a refractive index of about 1. Thus, refractive indexes of the first semiconductor layer 105, the substrate 101, and the first conductive type semiconductor layer 110 exceed about 1. Also, the first semiconductor layer 105, the substrate 101, and the first conductive type semiconductor layer 110 have refractive indexes greater than those of the opening part 107 and the air-gap part 109. Thus, the critical angle of the proceeding light may be changed due to the different media. The air-gap part 109 may have a close-type structure within the semiconductor light emitting device.

The air-gap part 109 and the opening part 107 disposed within the light emitting device 100 may refracts or reflects the light proceeding through the semiconductor layer to change the critical angle of the light. Also, the convex part 103 of the substrate 101, the air-gap part 109 and the opening part 107 disposed within the light emitting device 100 may refracts or reflects the light proceeding through the semiconductor layer or the substrate 101 to change a critical angle of the light.

Here, Since GaN has a refractive index of about 2.5 and air has a refractive index of about 1, when a critical angle for extracting light is greater than about 23.58° at an interface between the GaN and the air, the light may be extracted. Also, since a sapphire substrate has a refractive index of about 1.8, when an angle between media of the GaN and the sapphire substrate is greater than about 46°, the light may be extracted. Thus, in an embodiment, a light extraction structure having air between the GaN and the sapphire substrate may be provided.

According to the first embodiment, the air-gap part 109 having a shape corresponding to a light extraction angle may be disposed on the interface between the substrate 101 and the first semiconductor layer 105 to improve external quantum efficiency.

The first conductive type semiconductor layer 110 is disposed on the first semiconductor layer 105 and the opening part 107. The first conductive type semiconductor layer 110 may be formed of a compound semiconductor of Group III-V elements. For example, the first conductive type semiconductor layer 110 may be formed of one of GaN, InN, AlN, InGaN, AlGaN, InAlGaN, and AlInN. A first conductive type dopant is doped into the first conductive type semiconductor layer 110. The first conductive type dopant may be an N-type dopant and contain Si, Ge, Sn, Se, or Te.

The opening part 107 may be maintained in configuration even through the first conductive type semiconductor layer 110 is disposed on the first semiconductor layer 105.

An undoped semiconductor layer (not shown) may be disposed between the first semiconductor layer 105 and the first conductive type semiconductor layer 110. The undoped semiconductor layer may be formed of an undoped GaN-based material.

The active layer 120 is disposed on the first conductive type semiconductor layer 110. The active layer 120 may have a single quantum well structure or a multiple quantum well (MQW) structure. The active layer 120 may have a composition formula of $In_xAl_yGa_{1-x-y}N$ ($0 \leq x \leq 1$, $0 \leq y \leq 1$). The active layer 120 comprises a well layer/a barrier layer having one or more structures of an InGaN/GaN structure, an InGaN/InGaN structure, an GaN/AlGaN structure, an GaN/GaN structure, a GaAs/AlGaAs structure, a GaAs/InGaAs structure, a GaP/AlGaP structure, and a GaP/InGaP structure. A band gap of the well layer may be less than a band gap of the barrier layer.

A first conductive type clad layer (not shown) may be disposed between the first conductive type semiconductor layer 110 and the active layer 120. The first conductive type clad layer may be formed of an N-type AlGaN-based material or a material having band gaps different from that of the active layer.

A second conductive type semiconductor layer 130 is disposed on the active layer 120. The second conductive type semiconductor layer 130 may be formed of a compound semiconductor of Group III-V elements. For example, the second conductive type semiconductor layer 130 may be formed of one of GaN, InN, AlN, InGaN, AlGaN, InAlGaN, and AlInN. The second conductive type semiconductor layer 130 may be realized using a P-type semiconductor layer doped with a second conductive type dopant. The second conductive type dopant may be a P-type dopant and include at least one of Mg, Zn, Ca, Sr, and Br. A second conductive type clad layer may be disposed between the second conductive type semiconductor layer 130 and the active layer 120. The second conductive type clad layer may be formed of an AlGaN-based material or a material having a band gap different from that of the active layer 120.

Another semiconductor layer may be further disposed above/below the respective semiconductor layers 110, 120, and 130, but is not limited thereto.

A transparent electrode layer (not shown) or a reflection electrode layer may be disposed on the second conductive type semiconductor layer 130. The transparent electrode layer may be formed of one of materials containing transparent oxide or a metal. For example, the transparent electrode layer may be formed of at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminium zinc oxide (AZO), antimony tin oxide (ATO), gallium zinc oxide (GZO), IrOx, RuOx, RuOx/ITO, Ni, Ag, ZnO, NiO, Ni/IrOx/Au, and Ni/IrOx/Au/ITO, but is not limited thereto. The transparent electrode layer may have a single layer structure or a multi-layered structure. The reflection electrode layer may be formed of Ag, Ni, Al, Rh, Pd, Ir, Ru, Mg, Zn, Pt, Au, Hf and a combination thereof.

FIGS. 3 to 7 are views illustrating a process of manufacturing the semiconductor light emitting device of FIG. 1.

Figure 3:
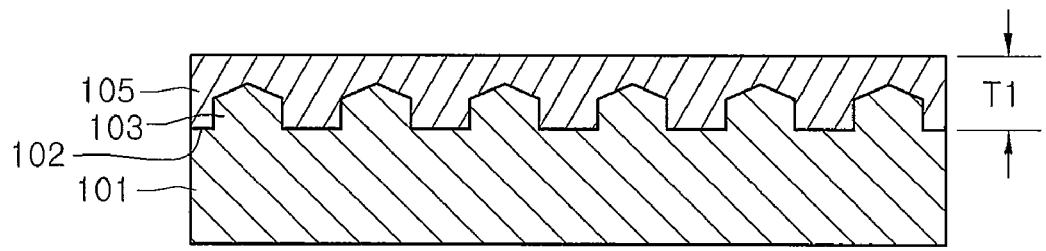
FIGS. 3 to 7 are views illustrating a process of manufacturing the semiconductor light emitting device of FIG. 1.
Figure 4:
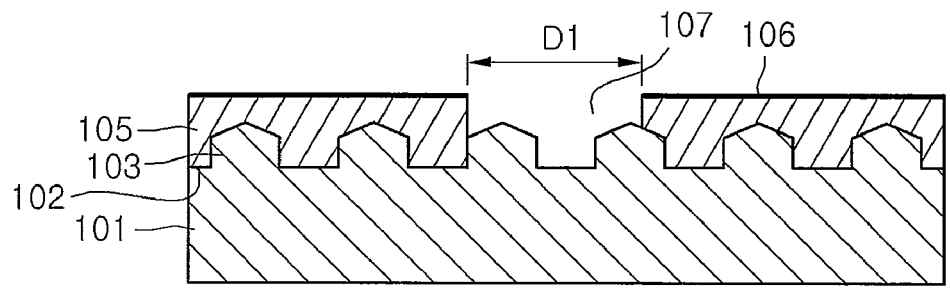

Referring to FIGS. 3 and 4, a substrate 101 is loaded on a growth equipment. A compound semiconductor of Group II to VI elements is grown on the substrate 101. The growth equipment may be one of a PVD (physical vapor deposition) equipment, a CVD (chemical vapor deposition) equipment, a PLD (plasma laser deposition) equipment, a dual-type thermal evaporator, a sputtering equipment, and an MOCVD (metal organic chemical vapor deposition) equipment, but is not limited thereto.

Concave and convex parts 102 and 103 are formed on the substrate 101. The concave and convex parts 102 and 103 may have a matrix or stripe shape. The convex part 103 may have a shape upwardly protruding from a top surface of the substrate 101. The convex part 103 may have a diameter of about 1 um to about 2 um and a height of about 1 um to about 2 um, but are not limited thereto. Here, the convex part 103 may have a protruding shape such as a convex lens shape, a column shape, a pillar shape, and a pyramid shape, circular cone or cone shape.

A first semiconductor layer 105 is formed on the substrate 101. The first semiconductor layer 105 may be formed of a compound semiconductor of Group III-V elements. The first semiconductor layer 105 may include an undoped semiconductor layer or a conductive semiconductor layer. For example, the first semiconductor layer 105 may be formed of one of compound semiconductors such as GaN, InN, AlN, InGaN, AlGaN, InAlGaN, and AlInN. The first semiconductor layer 105 may have a thickness T1 of about 0.01 um to about 20 um.

An opening part 107 may be defined within the first semiconductor layer 105. A mask layer 106 may be patterned using a photolithography process to form the opening part 107 within the first semiconductor layer 105. For example, the mask layer 106 may have a predetermined pattern in position. Also, the mask layer 106 may be formed of a material such as $SiO_2$.

The first semiconductor layer 105 is dry-etched (e.g., ICP) and/or wet-etched through an opened region in which the mask layer is patterned. The opening part 107 is formed within the first semiconductor layer 105, and the substrate 101 is exposed through the opening part 107.

Here, the opening part 107 may have a diameter D1 of about 0.01 um to about 10 um. The diameter D1 of the opening part 107 may be defined within a predetermined range to maintain a portion of the opening part 107 or the entire opening part 107 when another semiconductor layer is grown on the opening part 107.

Figure 5:
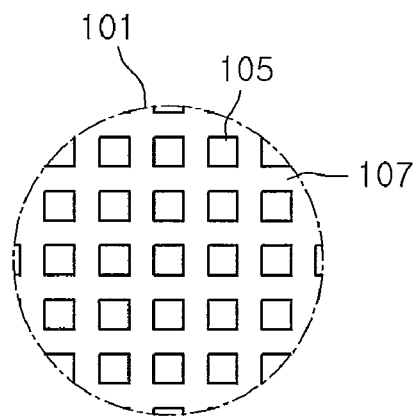

FIG. 5 is a plan view illustrating the opening part of FIG. 4. The opening part 107 of the first semiconductor layer 105 may have, for example, a mash shape on the substrate 101. Also, the opening part 107 may have a stripe shape or a matrix shape, but is not limited thereto. Here, the opening part 107 of the first semiconductor layer 105 may have a circular, polygonal, or atypical shape, but is not limited thereto.

The opening part 107 of the first semiconductor layer 105 may be provided in plurality within one chip, but is not limited thereto.

Figure 6:
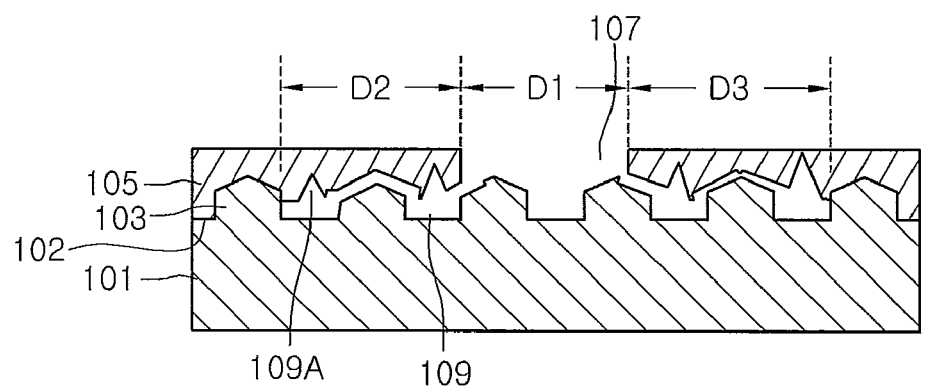

Referring to FIG. 6, when the opening part 107 is defined within the first semiconductor layer 105, a wet etching process is performed through the opening part 107. The wet etching process is performed to define an air-gap part 109 around the opening part 107. The air-gap part 109 is connected to the opening part 107 and extends outwardly from the opening part 107 by predetermined lengths D2 and D3. Here, a material used for the wet etching process may be KOH or AZ300, but is not limited thereto.

The opening part 107 may be disposed at a center or a side of the air-gap part 109. One or more convex parts 103 of the substrate 101 may be disposed in a region of the opening part 107.

A bottom of the first semiconductor layer 105 or a tope surface of the substrate 101 may have an uneven concave-convex shape by the air-gap part 109. A wet etchant injected into the opening part 107 is permeated into an interface between the first semiconductor layer 105 and the substrate 101. At this time, the almost wet etchant is moved along the interface between the first semiconductor layer 105 and the substrate 101 while etching a lower portion of the first semiconductor layer 105. The air-gap part 109 has an irregular gap along the interface between the first semiconductor layer 105 and the substrate 101.

Here, a portion 109A of the air-gap part 109 may have a sharp shape (e.g., cone shape) at a boundary between the air-gap part 109 and the lower portion of the first semiconductor layer 105. Such the sharp shape may provide a light extraction angle. For example, the portion 109A of the air-gap part 109 may have a structure that may change a critical angle of light.

The opening part 107 may be selectively formed at the inside, a center region, and an edge region of the chip. When the opening part 107 is formed at the center region of the chip, the air-gap part 109 may extend toward the edge region of the chip. When the opening part 107 is formed at the edge region of the chip, the air-gap part 109 may be formed around the edge region of the chip.

Thereafter, the mask layer illustrated in FIG. 4 is removed.

Figure 7:
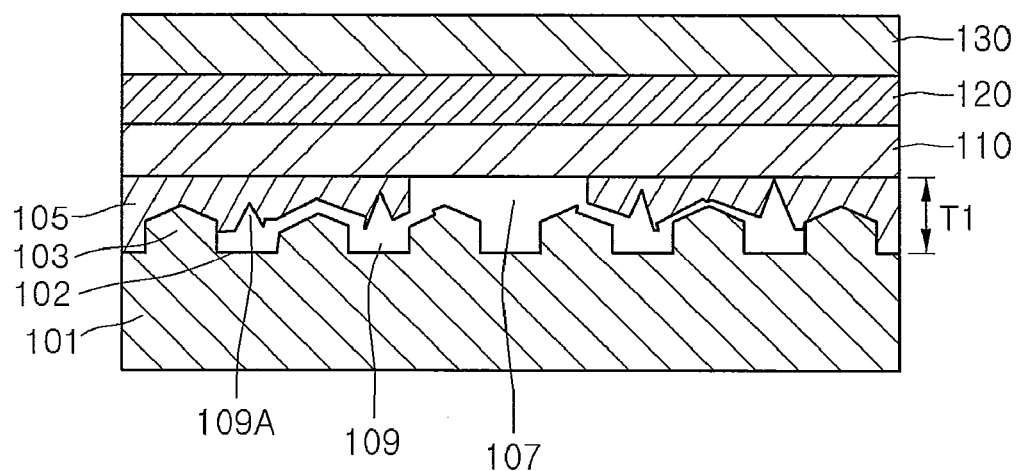

Referring to FIG. 7, a first conductive type semiconductor layer 110 is formed on the first semiconductor layer 105. A portion of the first conductive type semiconductor layer 110 may serve as a first electrode contact layer. The first conductive type semiconductor layer 110 may be formed of a compound semiconductor of Group III-V elements. For example, the first conductive type semiconductor layer 110 may be formed of one of GaN, InN, AlN, InGaN, AlGaN, InAlGaN, and AlInN. A first conductive type dopant is doped into the first conductive type semiconductor layer 110. The first conductive type dopant may be an N-type dopant and contain Si, Ge, Sn, Se, or Te.

An undoped semiconductor layer (not shown) may be disposed between the first semiconductor layer 105 and the first conductive type semiconductor layer 110. The undoped semiconductor layer may be formed of an undoped GaN-based material. Hereinafter, a structure in which the first conductive type semiconductor layer 110 is formed on the first semiconductor layer 105 will be described as an example.

The opening part 107 of the first semiconductor layer 105 may be in an opening region even through the first conductive type semiconductor layer 110 is formed. The opening part 107 may be changed in configuration according to a size thereof or growth conditions (e.g., pressure, gas, etc.) of the first conductive type semiconductor layer 110. Also, a portion of the opening part 107 may be filled with the first conductive type semiconductor layer 110.

The active layer 120 is formed on the first conductive type semiconductor layer 110. The active layer 120 may have a single quantum well structure or a multiple quantum well (MQW) structure. The active layer 120 may have a composition formula of $In_xAl_yGa_{1-x-y}N$ ($0 \leq x \leq 1$, $0 \leq y \leq 1$). The active layer 120 comprises a well layer/a barrier layer having one or more structures of an InGaN/GaN structure, an InGaN/InGaN structure, an GaN/AlGaN structure, an GaN/GaN structure, a GaAs/AlGaAs structure, a GaAs/InGaAs structure, a GaP/AlGaP structure, and a GaP/InGaP structure. A band gap of the well layer may be less than a band gap of the barrier layer. A first conductive type clad layer (not shown) may be disposed between the first conductive type semiconductor layer 110 and the active layer 120. The first conductive type clad layer may be formed of an N-type AlGaN-based material or a material having band gaps different from the active layer 120.

A second conductive type semiconductor layer 130 is formed on the active layer 120. The second conductive type semiconductor layer 130 may be formed of a compound semiconductor of Group III-V elements. For example, the second conductive type semiconductor layer 130 may be formed of one of GaN, InN, AlN, InGaN, AlGaN, InAlGaN, and AlInN. The second conductive type semiconductor layer 130 may be realized using a P-type semiconductor layer doped with a second conductive type dopant. The second conductive type dopant may be a P-type dopant and include at least one of Mg, Zn, Ca, Sr, and Br. A second conductive type clad layer may be disposed between the second conductive type semiconductor layer 130 and the active layer 120. The second conductive type clad layer may be formed of an AlGaN-based material or a material having a band gap different from that of the active layer 120.

Another semiconductor layer may be further disposed above/below the respective semiconductor layers 110, 120, and 130, but is not limited thereto.

The first conductive type semiconductor layer 110, the active layer 120, and the second conductive type semiconductor layer 130 may be defined as a light emitting structure.

A transparent electrode layer (not shown) or a reflection electrode layer may be formed on the second conductive type semiconductor layer 130.

In the semiconductor light emitting device 100, the first conductive type semiconductor layer 110 may be realized using a P-type semiconductor layer, and the second conductive type semiconductor layer 130 may be realized using an N-type semiconductor layer. A semiconductor layer having a polarity opposite to that of the second conductive type semiconductor layer may be formed on the second conductive type semiconductor layer 130. Thus, the semiconductor light emitting device 100 may have one of an N-P junction structure, a P-N junction structure, an N-P-N junction structure, and a P-N-P junction structure.

Figure 8:
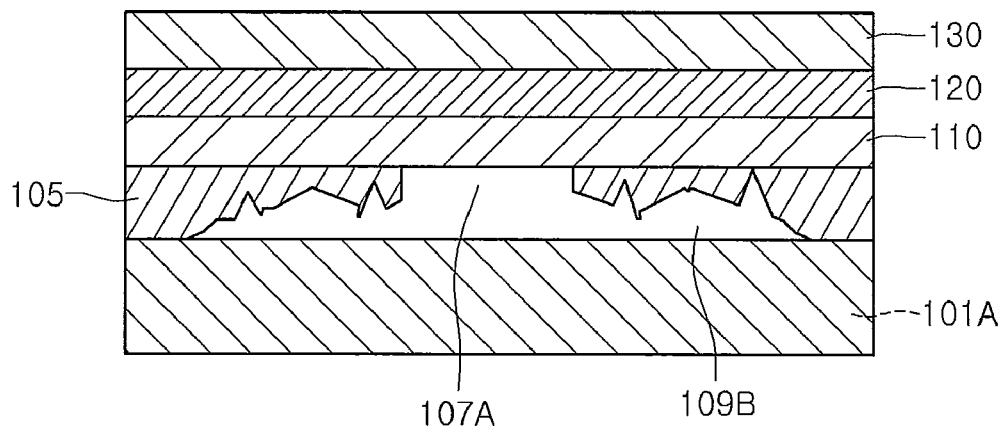
FIG. 8 is a side sectional view of a semiconductor light emitting device according to a second embodiment.

FIG. 8 is a side sectional view of a semiconductor light emitting device according to a second embodiment. In description of the second embodiment, the same parts as those of the first embodiment will be described with reference to the first embodiment.

Referring to FIG. 8, in a semiconductor light emitting device 100A, a substrate 101A has a flat top surface. Since a concave-convex part is not provided on the substrate 101A, a degree of a wet etching may be changed.

Since the substrate 101A has the flat top surface, an opening part 107A exposing a portion of the substrate 101A is defined in a first semiconductor layer 105. An air-gap part 109B is connected to the opening part 107A.

The air-gap part 109B may be disposed along an interface between the first semiconductor layer 105 and the substrate 101A by a wet etchant introduced through the opening part 107B. The air-gap part 109B may have an uneven structure between the first semiconductor layer 105 and the substrate 101A by performing the wet etching process on the first semiconductor layer 105.

When compared to the first embodiment, the air-gap part 109B may be different from that of the first embodiment in degree and configuration when the first semiconductor layer 105 is etched, but are not limited thereto.

Figure 9:
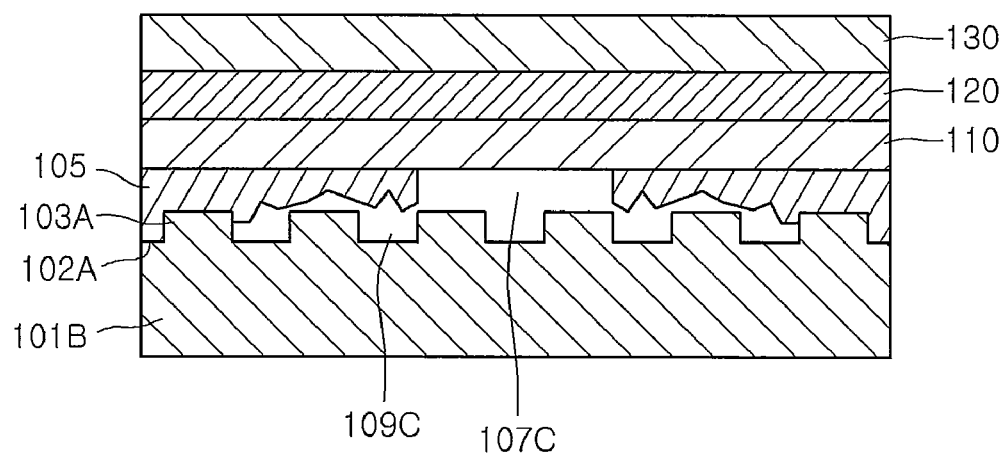
FIG. 9 is a side sectional view of a semiconductor light emitting device according to a third embodiment.

FIG. 9 is a side sectional view of a semiconductor light emitting device according to a third embodiment. In description of the third embodiment, the same parts as those of the first embodiment will be described with reference to the first embodiment.

Referring to FIG. 9, in a semiconductor light emitting device 100B, concave and convex parts 102A and 103A are disposed on a substrate 101B. The concave and convex parts 102A and 103A may have a plurality of stripe shapes.

An opening part 107C is defined in a predetermined position of a first semiconductor layer 105. The opening part 107C exposes a top surface of the substrate 101B. A wet etching process is performed to define an air-gap part 109C on an interface between the substrate 101B and the first semiconductor layer 105. The air-gap part 109C has a concave-convex shape according to the concave and convex parts 102A and 103A having the stripe shapes.

The concave and convex parts 102A and 103A, the opening part 107C, and the air-gap part 109C may refracts or reflects light proceeding to the substrate 101B. A critical angle of the reflected or refracted light may be changed and extracted to the outside of a chip. Also, a proceeding angle of the light may be changed by the concave and convex parts 102A and 103A of the substrate 101B to emit the light into an external device.

Figure 10:
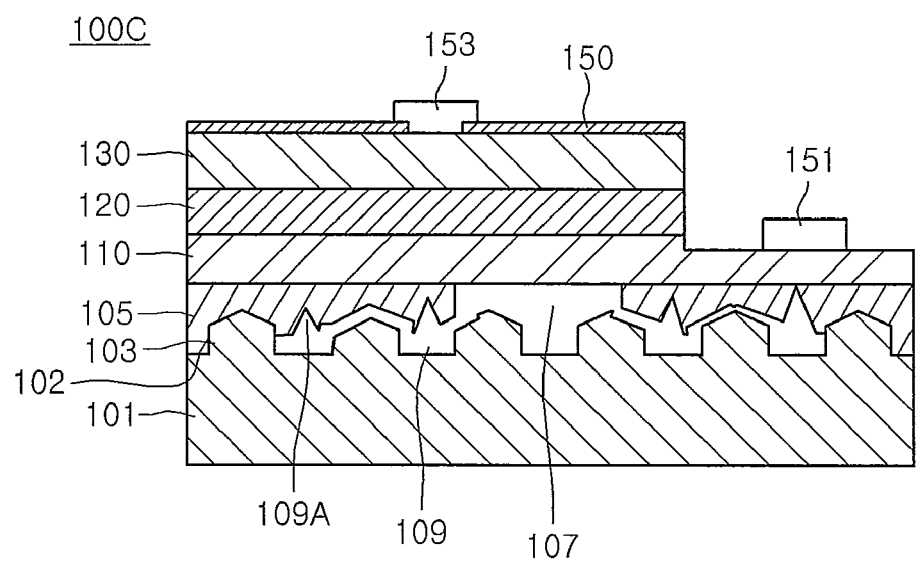
FIG. 10 is a side sectional view of a semiconductor light emitting device according to a fourth embodiment.

FIG. 10 is a side sectional view of a semiconductor light emitting device according to a fourth embodiment. In description of the fourth embodiment, the same parts as those of the first embodiment will be described with reference to the first embodiment.

Referring to FIG. 10, a semiconductor light emitting device 100C include an electrode layer 150 on a second conductive type semiconductor layer 130, a first electrode 151 electrically connected to a first conductive type semiconductor layer 110, and a second electrode 153 electrically connected to the second conductive type semiconductor layer 130.

A mesa etching process may be performed to form the first electrode 151 on a side of the first conductive type semiconductor layer 110. An electrode layer 150 is disposed on the second conductive type semiconductor layer 130, and the electrode layer 150 includes a transparent electrode layer or a reflection electrode layer.

The transparent electrode layer may be formed of one of materials containing transparent oxide or a metal. For example, the transparent electrode layer may be formed of at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminium zinc oxide (AZO), antimony tin oxide (ATO), gallium zinc oxide (GZO), IrOx, RuOx, RuOx/ITO, Ni, Ag, ZnO, NiO, Ni/IrOx/Au, and Ni/IrOx/Au/ITO. The transparent electrode layer may have a single layer structure or a multi-layered structure. The reflection electrode layer may be formed of Ag, Ni, Al, Rh, Pd, Ir, Ru, Mg, Zn, Pt, Au, Hf and a combination thereof.

The second electrode 153 is disposed on the electrode layer 150. A portion of the second electrode layer 153 may contact the second conductive type semiconductor layer 130 through an open region of the electrode layer 150. Thus, the second electrode 153 may indirectly or directly contact the electrode layer 150 and the second conductive type semiconductor layer 130.

The second electrode 153 includes an electrode pad. A branch pattern having an arm structure may be disposed on the electrode pad, but is not limited thereto.

An opening part 107 of the first semiconductor layer 105 is disposed inside a chip. An air-gap part 107 is connected to the opening part 107 and extends in an edge direction within the chip.

Figure 11:
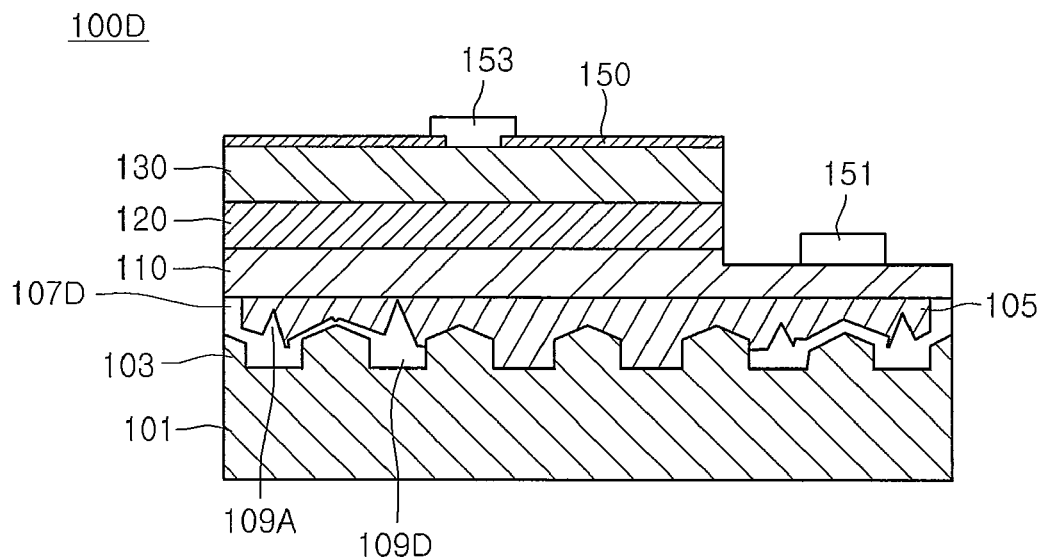
FIG. 11 is a side sectional view of a semiconductor light emitting device according to a fifth embodiment.

FIG. 11 is a side sectional view of a semiconductor light emitting device according to a fifth embodiment. In description of the fifth embodiment, the same parts as those of the above-described embodiments will be described with reference to the above-described embodiments.

Referring to FIG. 11, a semiconductor light emitting device 100D includes an opening part 107D in an edge region of a chip. A first semiconductor layer 105 is disposed on a substrate 101. The opening part 107D is defined in a boundary region between chips. The chips are individually divided along the boundary region between the chips. The opening part 107D is disposed in a boundary portion of the chip, i.e., the chip edge region. The air-gap part 109D extends from the chip edge toward the inside of the chip. The air-gap part 109D may have an open-type structure within the semiconductor light emitting device. In this embodiment, the opening part 107D may be disposed along the chip edge, one or more opening parts 107 may be disposed within the chip, or the opening part 107D is not provided within the chip.

In another embodiment, an etching mask pattern (e.g., SiO$_2$) having a concave-convex shape, is disposed on a substrate. Then, a first semiconductor layer is disposed on the substrate to perform a wet etching process through an opening part. At this time, the opening part has a gap having a concave-convex shape, and an interface between the first semiconductor layer and the substrate and the etching mask pattern are etched through the opening part.

Figure 12:
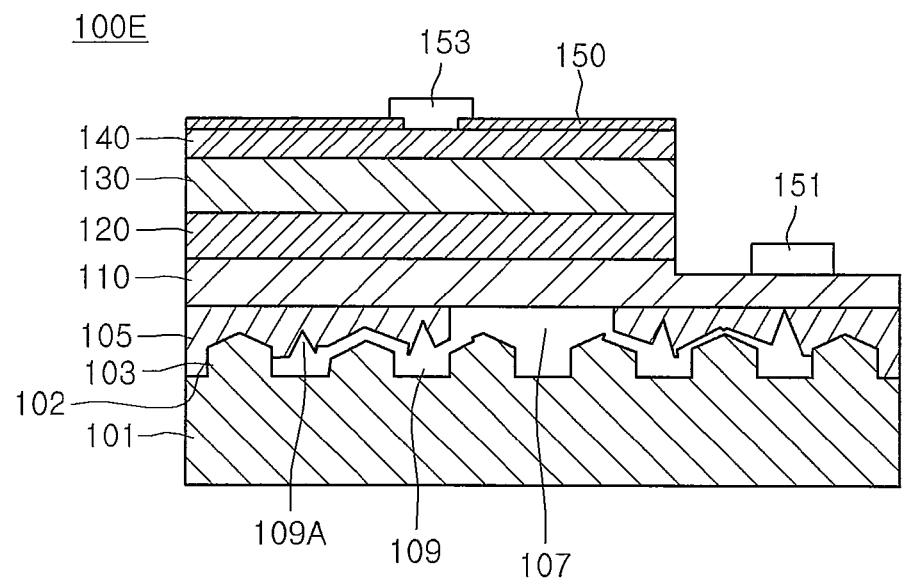
FIG. 12 is a side sectional view of a semiconductor light emitting device according to a sixth embodiment.

FIG. 12 is a side sectional view of a semiconductor light emitting device according to a sixth embodiment. In description of the sixth embodiment, the same parts as those of the above-described embodiments will be described with reference to the above-described embodiments.

Referring to FIG. 12, a semiconductor light emitting device 100E includes a third conductive type semiconductor layer 140 on a second conductive type semiconductor layer 130 and an electrode layer 150. A first electrode 151 is electrically connected to a first conductive type semiconductor layer 110. Here, the first electrode may be disposed on the first conductive type semiconductor layer 110, and thus electrically connected to each other. Also, the first electrode may be electrically connected to the first conductive type semiconductor layer 110 through a through-hole structure.

The third conductive type semiconductor layer 140 has a polarity opposite to that of the second conductive type semiconductor layer 130. The third conductive type may be formed of a compound semiconductor of Group III-V elements, but is not limited thereto.

An insulation layer may be disposed around the semiconductor layers 105 and 140 to improve electrostatic discharge (ESD), but is not limited thereto.

Figure 13:
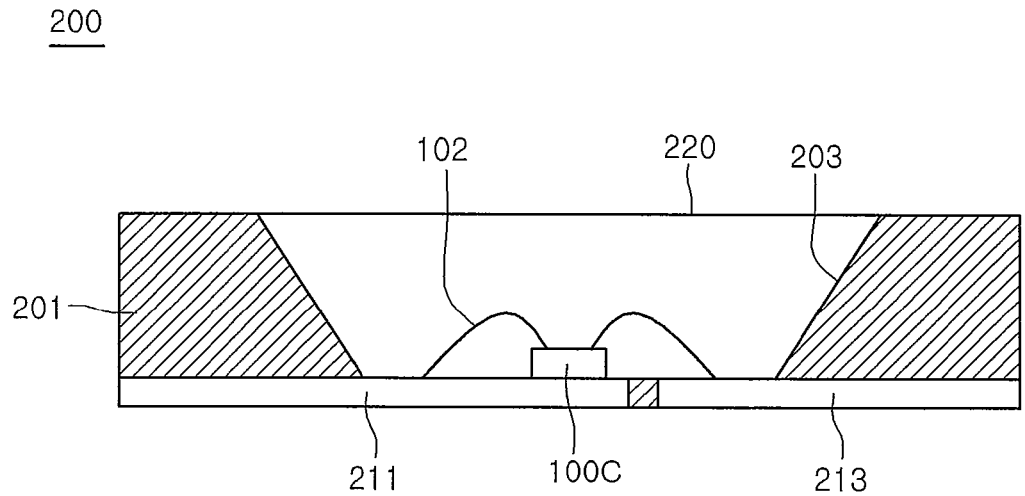
FIG. 13 is a side sectional view of a light emitting device package according to a seventh embodiment.

FIG. 13 is a side sectional view of a semiconductor light emitting device according to a seventh embodiment.

Referring to FIG. 13, a light emitting package 200 includes a body part 201, first and second lead electrodes 211 and 213 disposed on the body part 201, a light emitting device 100C according to this embodiment electrically connected to the first and second lead electrodes 211 and 213 disposed on the body part 201, and a molding member 220 surrounding the light emitting device 100C.

The body part 201 may be formed of a silicon material, a synthetic resin, or a metal material. An inclined surface may be disposed around the light emitting device 100C. A cavity 203 having an opened upper side may be defined in the body part 201, but is not limited thereto.

The first and second lead electrodes 211 and 213 are electrically separated from each other to provide a power to the light emitting device 100C. The first and second lead electrodes 211 and 213 may reflect light generated from the light emitting device 100C to improve optical efficiency. Also, the first and second lead electrodes 211 and 213 may emit heat generated in the light emitting device 100C to the outside.

The light emitting device 100C may be disposed on the body part 201 or the first and second lead electrodes 211 and 213.

The light emitting device 100C may be electrically connected to the first and second lead electrodes 211 and 213 through a wire 102. The light emitting devices of FIGS. 10 to 12 except the light emitting device 100C may be selectively applicable to this embodiment. The light emitting devices may be mounted through the wire, die bonding, or flip-chip method, but is not limited thereto.

The molding member may surround the light emitting device 100C to protect the light emitting device 100C. Also, a phosphor is contained in the molding member 220 to change a wavelength of light emitted from the light emitting device 100C.

The semiconductor light emitting device according to the embodiments may be packaged onto a semiconductor substrate formed of a resin material or silicon, an insulation substrate, or a ceramic substrate. Also, the semiconductor light emitting device may be used as light sources of an indication device, a lighting device, and a display device. The respective embodiments are not limited to each of the embodiments and may be selectively applicable to other embodiments described above.

The light emitting device package according to an embodiment may be applicable to a lighting system. The lighting system may include a lighting unit illustrated in FIG. 14, a backlight unit illustrated in FIG. 15, traffic lights, a vehicle headlight, and a sign.

Figure 14:
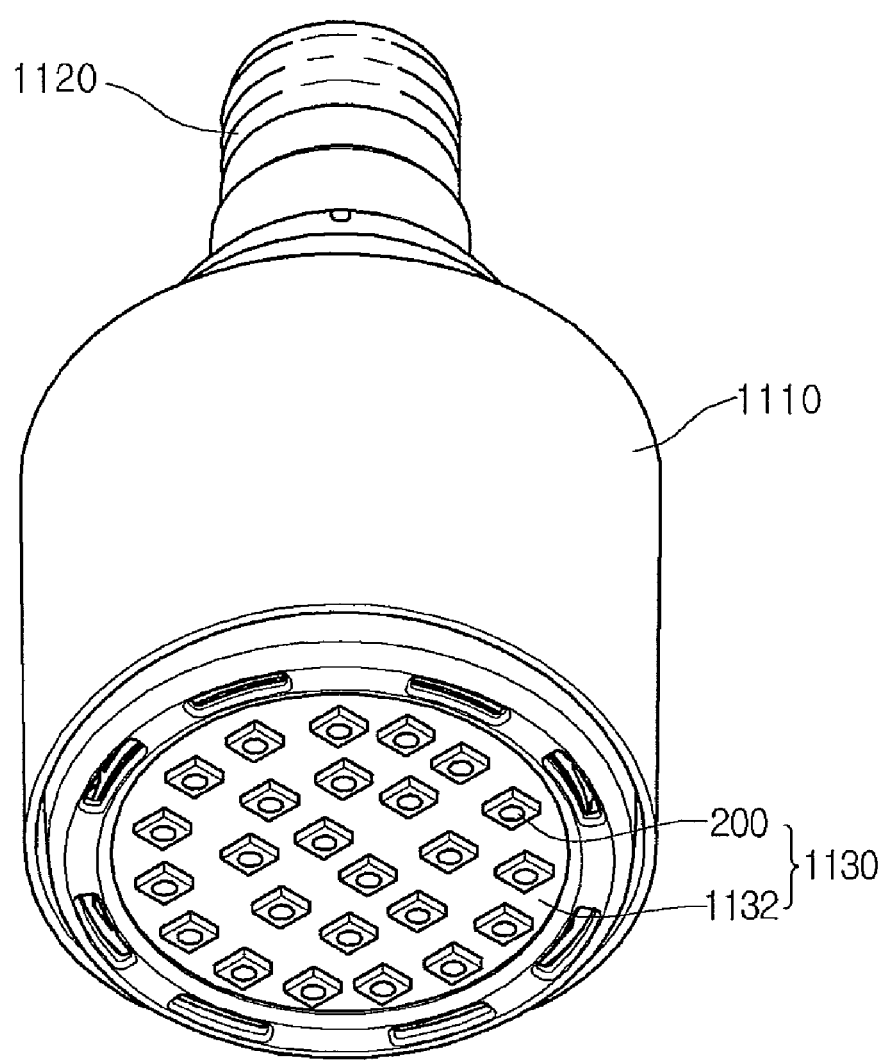
FIG. 14 is a perspective view of a lighting unit according to an embodiment.

FIG. 14 is a perspective view of a lighting unit according to an embodiment.

Referring to FIG. 14, a lighting unit 1100 may include a case body 1110, a light emitting module 1130 disposed in the case body 1110, and a connection terminal 1120 disposed in the case body 1110 to receive a power from an external power source.

The case body 1110 may be formed of a material having an improved heat dissipation characteristic. For example, the case body 1110 may be formed of a metal material or resin material.

The light emitting module 1130 may include a substrate 1132 and at least one light emitting device package 1210 mounted on the substrate 1132.

A circuit pattern may be printed on an insulation material to form the substrate 1132. For example, the substrate 1132 may include a printed circuit board (PCB), a metal core PCB, a flexible PCB, or a ceramic PCB.

Also, the substrate 1132 may be formed of a material that can effectively reflect light. A surface of the substrate 1132 may be coated with a colored material, e.g., a white or silver-colored material by which light is effectively reflected.

At least one light emitting device package 1210 may be mounted on the substrate 1132. The light emitting device package 1210 may include at least one light emitting diode (LED) 100. The LED 100 may include a colored LED that emits red, green, blue, or white light and an UV LED that emits ultraviolet (UV) light.

The light emitting module 1130 may include a plurality of light emitting device packages 1210 to obtain various colors and brightness. For example, a white LED, a red LED, and a green LED may be disposed in combination with each other to secure a high color rendering index (CRI).

The connection terminal 1120 may be electrically connected to the light emitting module 1130 to supply a power. Although the connection terminal 1120 is screw-inserted into an external power source in a socket manner, the present disclosure is not limited thereto. For example, the connection terminal 1120 may have a pin shape. Thus, the connection terminal 1120 may be inserted into the external power source or connected to the external power using an interconnection.

Figure 15:
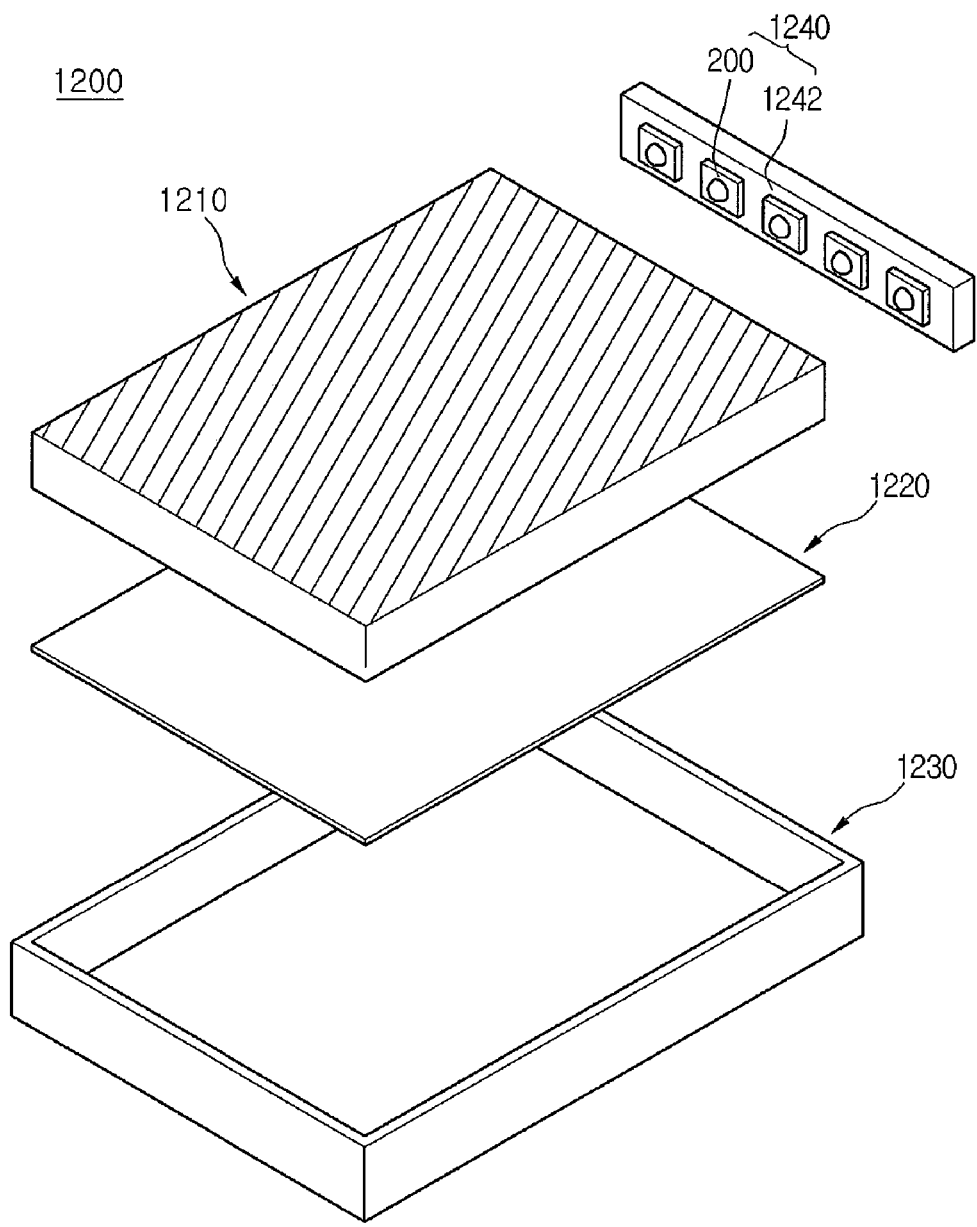
FIG. 15 is a perspective view of a backlight unit according to an embodiment.

FIG. 15 is a perspective view of a backlight unit according to an embodiment.

A backlight unit 1200 according to an embodiment may include a light guide plate 1210, a light emitting module 1240, a reflective member 1220, and a bottom cover 1230, but is not limited thereto. The light emitting module 1240 may contact at least one surface of the light guide plate 1210 to provide light the light guide plate 1210, but is not limited thereto. The reflective member 1220 may be disposed below the light guide plate 1210. The bottom cover 1230 may receive the light guide plate 1210, the light emitting module 1240, and the reflective member 1220.

The light guide plate 1210 may diffuse light to produce planar light. The light guide plate 1210 may be formed of a transparent material. For example, the light guide plate 1210 may be formed of one of an acrylic resin-based material such as polymethylmethacrylate (PMMA), a polyethylene terephthalate (PET) resin, a poly carbonate (PC) resin, a cyclic olefin copolymer (COC) resin, and a polyethylene naphthalate (PEN) resin.

The light emitting module 1240 may provide light to at least one surface of the light guide plate 1210. Thus, the light emitting module 1240 may be used as a light source of a display device including the backlight unit.

The light emitting module 1240 may contact the light guide plate 1210 but is not limited thereto.

In particular, the light emitting module 1240 may include a substrate 1242 and a plurality of light emitting device package 200 mounted on the substrate 1242. The substrate 1242 may contact the light guide plate 1210, but is not limited thereto.

The substrate 1242 may be a PCB including a circuit pattern (not shown). However, the substrate 1242 may include a metal core PCB or a flexible PCB as well as the PCB, but is not limited thereto.

The plurality light emitting device packages 200 may be mounted on the substrate 1242. Also, a light emitting surface of each of the light emitting device packages 200 may be spaced a predetermined distance from the light guide plate 1210.

The reflective member 1220 may be disposed below the light guide plate 1210. The reflective member 1220 reflects light incident onto a bottom surface of the light guide plate 1210 to proceed in an upward direction, thereby improving brightness of the backlight unit. For example, the reflective member 1220 may be formed of one of PET, PC, and PVC, but is not limited thereto.

The bottom cover 1230 may store the light guide plate 1210, the light emitting module 1240, and the reflective member 1220. For this, the bottom cover 1230 may have a box shape with an opened upper side, but is not limited thereto.

The bottom cover 1230 may be formed of a metal material or a resin material. Also, the bottom cover 1230 may be manufactured using a press forming process or an extrusion molding process.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor light emitting device, comprising:
a substrate;
a first semiconductor layer on the substrate;
an opening part within the first semiconductor layer;
an air-gap part disposed between a portion of the substrate and a portion of the first semiconductor layer; and
a plurality of compound semiconductor layers on the first semiconductor layer and comprising a first conductive type semiconductor layer, an active layer, and a second conductive type semiconductor layer, wherein the air-gap part has irregular peaks and gaps along an interface between the first semiconductor layer and the substrate, and wherein the plurality of compound semiconductor layers has a first portion disposed on the opening part and a second portion disposed on the first semiconductor layer.

2. he semiconductor light emitting device according to claim 1, wherein the first semiconductor layer is formed of a Group III-V compound semiconductor.

3. The semiconductor light emitting device according to claim 1, wherein the first semiconductor layer comprises an undoped semiconductor layer or a conductive type semiconductor layer.

4. The semiconductor light emitting device according to claim 1, wherein the opening part is connected to the air-gap part.

5. The semiconductor light emitting device according to claim 4, wherein the opening part has a diameter of about 0.01 µm to about 10 m.

6. The semiconductor light emitting device according to claim 4, wherein the air-gap part has a length greater than that of the opening part.

7. The semiconductor light emitting device according to claim 1, wherein the air-gap part comprises a close-type air-gap part or an open-type air-gap part.

8. The semiconductor light emitting device according to claim 4, wherein the air-gap part extends by a predetermined length along the interface between the first semiconductor layer and the substrate.

9. The semiconductor light emitting device according to claim 1, comprising a third conductive type semiconductor layer on the second conductive type semiconductor layer, wherein the third conductive type semiconductor layer has a polarity opposite to that of the second conductive type semiconductor layer.

10. A semiconductor light emitting device, comprising:
a substrate having a top surface with a concave-convex structure;
a first semiconductor layer on the substrate;
an air-gap part between the substrate and the first semiconductor layer;
an opening part within the first semiconductor layer; and
a plurality of compound semiconductor layers having a first portion disposed on the opening part and a second portion disposed on the first semiconductor layer, the plurality of compound semiconductor layers comprising a first conductive type semiconductor layer, an active layer, and a second conductive type semiconductor layer,
wherein the air-gap part extends for a predetermined length along an interface between the first semiconductor and the substrate.

11. The semiconductor light emitting device according to claim 10, wherein the concave-convex structure has one of a matrix shape or a stripe shape.

12. The semiconductor light emitting device according to claim 10, wherein the air-gap part includes irregular gaps and peaks between the substrate and the first semiconductor layer.

13. The semiconductor light emitting device according to claim 10, wherein the first semiconductor layer comprises an undoped semiconductor layer or a conductive type semiconductor layer.

14. The semiconductor light emitting device according to claim 10, wherein the opening part is connected to the air-gap part.

15. The semiconductor light emitting device according to claim 10, wherein the concave-convex structure of the substrate is disposed at the air-gap part and is formed as an irregular shape or a random shape.

16. The semiconductor light emitting device according to claim 15, comprising a first electrode electrically connected to the first conductive type semiconductor layer and a second electrode electrically connected to the second conductive type semiconductor layer.

17. A semiconductor light emitting device, comprising:
a substrate;
a concave-convex part on the substrate;
a first semiconductor layer on the substrate;
an air-gap part between the substrate and the first semiconductor layer;
an opening part within the first semiconductor layer;
a first conductive type semiconductor layer having a first portion on the first semiconductor layer and a second portion on the opening part;
an active layer on the first conductive type semiconductor layer;
a second conductive type semiconductor layer on the active layer;
a first electrode electrically connected to the first conductive type semiconductor layer; and
a second electrode electrically connected to the second conductive type semiconductor layer,
wherein the air-gap part extends for a predetermined length along an interface between the first semiconductor and the substrate, and
wherein the air-gap part has irregular peaks and gaps along the interface between the first semiconductor layer and the substrate.

18. The semiconductor light emitting device according to claim 17,
wherein the opening part connects the first conductive type semiconductor layer to the substrate.

19. The semiconductor light emitting device according to claim 17, wherein the first electrode is disposed on the first conductive type semiconductor layer, and the second electrode is disposed on the second conductive type semiconductor layer.

* * * * *